United States Patent [19]
Lee et al.

[11] Patent Number: 6,054,722
[45] Date of Patent: *Apr. 25, 2000

[54] COMPLEMENTARY FIELD EFFECT DEVICES FOR ELIMINATING OR REDUCING DIODE EFFECT

[75] Inventors: Kua-Hua Lee; Chun-Ting Liu, both of Wescosville, Pa.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/848,141

[22] Filed: Apr. 28, 1997

Related U.S. Application Data

[63] Continuation of application No. 08/572,196, Dec. 14, 1995, Pat. No. 5,625,200, which is a continuation of application No. 08/298,258, Aug. 30, 1994, abandoned.

[51] Int. Cl.[7] .......................... H01L 27/108; H01L 27/01; H01L 27/11
[52] U.S. Cl. ........................... 257/69; 257/350; 257/377; 257/383; 257/384; 257/393; 257/903; 257/904
[58] Field of Search ................................ 257/69, 350, 351, 257/377, 383, 384, 393, 903, 904

[56] References Cited

U.S. PATENT DOCUMENTS

| | | | |
|---|---|---|---|
| 4,814,841 | 3/1989 | Masuoka et al. | 257/903 |
| 5,331,170 | 7/1994 | Hayashi | 257/903 |
| 5,625,200 | 4/1997 | Lee et al. | 257/903 |

FOREIGN PATENT DOCUMENTS

| | | | |
|---|---|---|---|
| 62-247559 | 10/1987 | Japan | 257/351 |

OTHER PUBLICATIONS

"Semiconductor Memory Process Integration" pp. 575 and 576, 1990.

*Primary Examiner*—Minh Loan Tran

[57] ABSTRACT

A complementary device consisting of a PMOS TFT transistor and an NMOS FET transistor uses a conducting layer to shunt drain regions of the transistors to eliminate any detrimental diode or p-n junction effects. The use of the conducting layer significantly improves the current drive capabilities of the PMOS TFT when the complementary device is used to design SRAM cells with NMOS pull-down transistors.

4 Claims, 2 Drawing Sheets

COMPLEMENTARY FIELD EFFECT DEVICES FOR ELIMINATING OR REDUCING DIODE EFFECT

This application is a continuation application of application Ser. No. 08/572,196, filed Dec. 14, 1995, now U.S. Pat. No. 5,625,200, which is a continuation of application Ser. No. 08/298,258, filed Aug. 30, 1994, now abandoned.

BACKGROUND OF THE INVENTION

1. Field of The Invention

The present invention relates to the fabrication and design of semiconductor devices generally, and particularly to the use of thin film transistors (TFTs) in complementary circuits with improved electrical characteristics.

2. Brief Description of The Prior Art

A thin film transistor (TFT) "stacked" or fabricated on top of another type of transistor is a device configuration which promotes high density of various types of circuitry. Because of the relatively small size of thin film transistors, it is economically advantageous to use them in integrated circuitry where device density is of paramount importance. These types of circuits include gate arrays and memory chips such as Static Random Access Memory (SRAM). A typical design of an SRAM makes use of both p-type and n-type field effect transistors (FETs) with their drain terminals connected to each other. This particular circuit commonly known as complementary configuration, uses TFTs as driving transistors stacked on top of another transistor which are then used to construct SRAM devices. TFTs used as driving transistors in SRAMs must have the requisite current drive capabilities that would ensure stable and reliable operation.

A major problem arises with the use of TFTs in complementary devices. As schematically illustrated in FIG. 1, in a complementary configuration where the drain regions of p-type and n-type transistors are connected in series, a p-n junction or diode is created between the two transistors. This "diode effect" can be readily understood by reviewing FIGS. 1–2A in conjunction with the text below.

Referring now to FIG. 1, there is shown a complementary circuit 1 consisting of a p-channel transistor 2 connected in series with an n-channel transistor 3. The diode effect is a result of an energy threshold barrier created by a p-n junction. Only currents having sufficient energy to overcome such barrier will flow through the p-n junction.

The drain 4 of the p-channel transistor 2 is connected to the drain 5 of the n-channel transistor. The device is structured so that a p-n junction or diode effect 6 is created. The p-n junction 6, shown in dashed line, describes a physical phenomenon that is created by the particular design of the complementary device shown in FIG. 1.

The diode or p-n junction is an incidental circuit element whose existence can best be understood and viewed in the diagrams of FIGS. 2 and 3. As shown in FIG. 2, a perspective view of the complementary device structure with an n-type polysilicon layer 16 that is used to isolate the p-channel transistor device 17 from the n-channel transistor device 18. In addition to shielding the p-channel transistor 17 from undesirable electric fields of the n-channel transistor 18, the n-type polysilicon layer 16 is located directly above the gate region 19 of the n-channel device 18 and defines the boundaries of the gate region 19. FIG. 2 also shows the source region 20 and the gate region 21 of the p-channel transistor. The source region 22 of the n-channel transistor is likewise shown in FIG. 2.

In a typical complementary device, a second n-type polysilicon layer 23 also located between transistor 17 and transistor 18 would come into contact with drain regions 24 and 25 of transistors 17 and 18 respectively. This layer serves to interconnect the drain regions of transistors 17 and 18. N-type polysilicon interconnecting layer 23 and drain region 24 of p-channel transistor 17 form a p-n junction 26 that can be clearly seen in the cross-sectional view of the complementary device shown in FIGS. 2 and 3. Also shown in FIG. 3 is the drain region 25 of the n-channel device which comes in contact with n-type polysilicon layer 23.

This diode effect becomes extremely problematic in many electronic circuits such as SRAM circuits where a p-channel TFT is used to drive an n-channel FET such that the drain regions of each device are adjacent to each other thus forming a p-n junction with each other or with polysilicon layer. For example, in a common circuit configuration, an NMOS FET driven by a PMOS TFT FET is used as a pull-down transistor whose drain is electrically and physically in contact with the drain of the PMOS TFT. When these complementary devices are used in SRAM memory cells, the "diode" effect severely diminishes memory cell stability and soft error immunity.

FIG. 1A shows a schematic of an SRAM cell consisting of two complementary devices and access transistors 7 and 8. The p-n junction effect is represented by diodes 9 and 10. This particular circuit schematic depicts the pull-down transistors 11 and 12 as n-channel devices, e.g. NMOS transistors. The pull down transistors are being driven by TFT p-channel transistors 13 and 14 whose source terminals 15A and 15B are commonly wired to power source $V_{cc}$. The ID currents shown flowing through each complementary device must be large enough to overcome the threshold energy barrier created by the p-n junction diodes. This additional current demand caused by the existence of the p-n junction serves to reduce the high density of transistors normally associated with semiconductor devices that are designed with TFTs. Not only will the number of SRAM cell in a memory integrated circuit be reduced, but each cell will dissipate more power as a result of the diode effect. Therefore the integrated circuit memory chip becomes less energy efficient as a result of the diode effect.

One suggestion to solve the diode effect when using TFTs in a stacked configuration with other transistors is based on manipulating the geometry of the TFT's channel region. However, this technique only reduces somewhat the diode effect by making the p-n junction "leaky." It does not completely or substantially eliminate the diode effect. Further, this technique requires various modifications in the TFT's fabrication process increasing the manufacturing cost of the complementary device.

Thus, what is needed and would be useful is a complementary device which uses TFTs in a stacked configuration fabricated in such a manner as to completely or substantially eliminate the diode effect while exploiting the high speed and high density characteristics of TFTs with little or no increase in fabrication cost.

OBJECTS OF THE INVENTION

Accordingly, it is an object of the present invention to provide a complementary semiconductor device that completely or substantially eliminates the diode effect.

Another object of this invention to provide a complementary device which can be used to design highly stable circuits.

It is a further object of this invention to provide a complementary device whose driving transistor has high current drive capabilities.

It is further another object of this invention to construct a highly stable, high current drive complementary device without deviating from the regular fabrication process.

It is yet another object of this invention to provide a complementary device having a TFT with improved current drive.

It is yet object of this invention to provide a complementary device with a TFT and whose solution to the diode effect is independent of the geometry of the TFT's channel.

It is yet another object of this invention to provide an energy efficient complementary device.

It is yet another object of this invention to provide a complementary device completely or substantially free of the diode effect with little or no increase in fabrication cost.

SUMMARY OF THE INVENTION

In accordance with the present invention a complementary device is described which has the high density and high speed capabilities heretofore discussed but with the diode effect completely or substantially eliminated. It has been discovered by the inventors that the addition of a conducting region within the complementary device serves to effectively shunt the diode effect created by the channels of p-type and n-type devices. N-type or p-type polysilicon layers used to isolate the n-channel devices from the p-channel devices also create p-n junctions. These p-n junctions can also be eliminated with the introduction of conducting material within the complementary device.

In a preferred embodiment of the present invention, a Tungsten silicide ($WSi_2$) layer is placed between the drain regions of the transistors replacing the insulating polysilicon layer. This interlayer shunts the drain of the driving transistor to the drain of the pull-down transistor. The addition of this interlayer does not at all affect the fabrication process of the complementary device. That is, no significant deviation from the normal fabrication process is necessary in order to add this conducting layer. This results in little or no increase in the fabrication cost of the complementary device. Although other conducting material can be used, the use of $WSi_2$ is preferable because it is a low stress material and has very good etching selectivity.

Another embodiment of the present invention uses the $WSi_2$ layer to shunt the drains of the transistors without having to remove the insulating polysilicon layer. It will be apparent to one of ordinary skill in the art that there are many ways in which the drain regions can be shunted even when polysilicon layers are used as isolating and interconnecting layers. However, the concept of electrically shunting one region to another is the central principle of this invention. The specific location and arrangement of the conducting layer within the complementary device in order to shunt a p-n junction depends on the particular structural design of the device. The voltage threshold effect and diode current normally associated with p-n junctions are completely or substantially eliminated by the addition of the shunting layer. The diode, in effect, is removed from the circuit allowing for a stable circuit with a high current drive.

BRIEF DESCRIPTION OF THE DRAWINGS

For a more complete understanding of the Objects of the Present Invention, the Detailed Description of the Illustrative Embodiments set forth below is to be read in conjunction with the accompanying drawings, wherein.

DESCRIPTION OF THE ILLUSTRATIVE EMBODIMENTS

Figure 1:
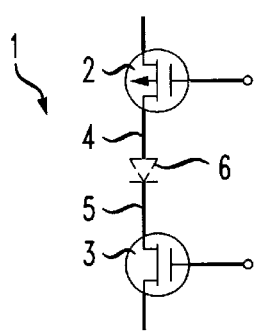
FIG. 1 is a schematic diagram of a complementary device having a p-channel and an n-channel device connected in series.
Figure 3:
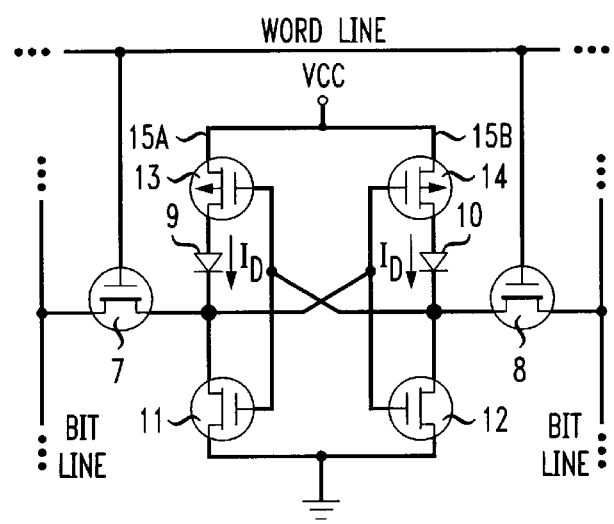
FIG. 3 is a schematic diagram of an SRAM cell.
Figure 4:
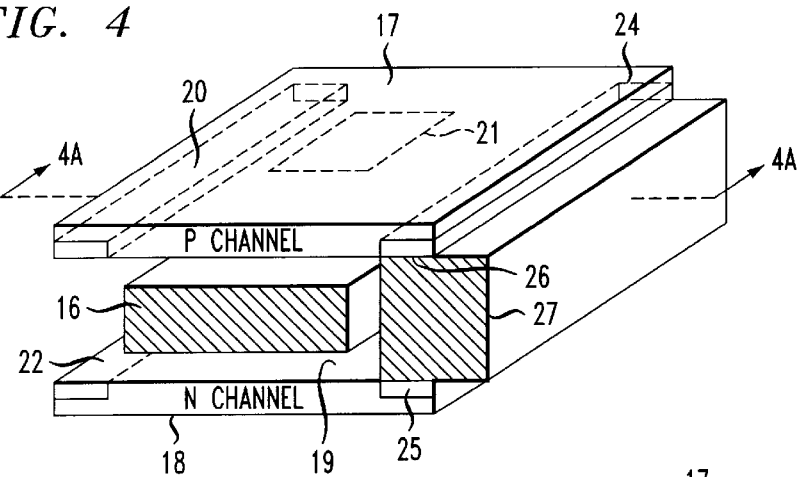
FIG. 4 is a perspective view of the inventive device showing a conducting layer of conducting material.
Figure 4A:
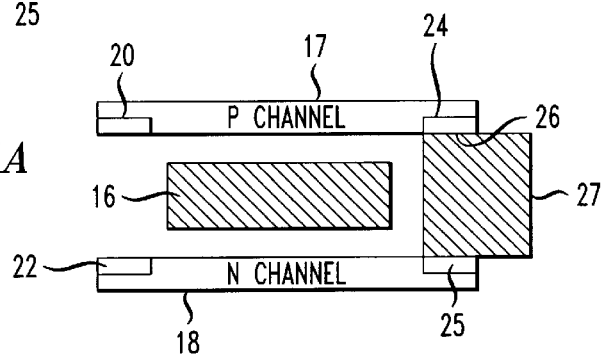
FIG. 4A is a cross sectional view of FIG. 4 along 4A—4A.

For purposes of illustration, the present invention shall be described with reference to FIGS. 4–5A in which two embodiments of a complementary device are discussed. In the inventive concept herein claimed and disclosed, the n-type polysilicon layer 23 shown in FIG. 3 is replaced with a conducting means or material such as $WSi_2$ which acts to shunt out the p-n junction or diode effect. This inventive conducting layer 27 is shown in FIG. 4. The p-n junction which was created by the drain of p-type transistor 17 with polysilicon layer 23 is eliminated by $WSi_2$ conducting layer 27. Also, the insertion of conducting layer 27 prevents a p-n junction between the drains of transistors 17 and 18 from forming.

Figure 2:
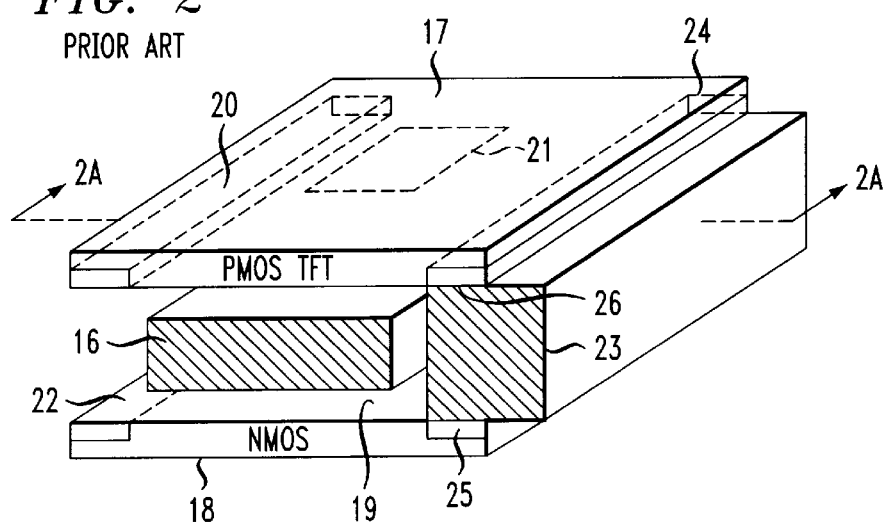
FIG. 2 is a perspective view of the structure of the complementary circuit shown in FIG. 1.
Figure 2A:
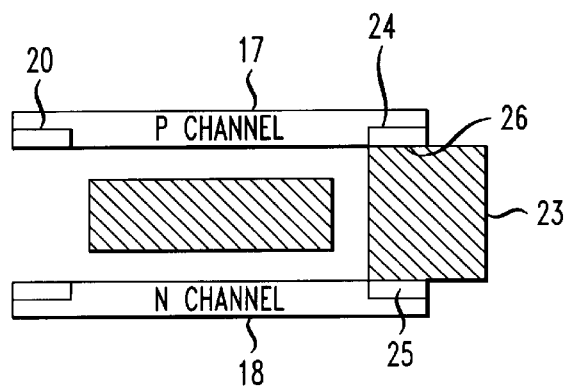
FIG. 2A is a cross sectional view of FIG. 2 along 2A—2A.
Figure 5:
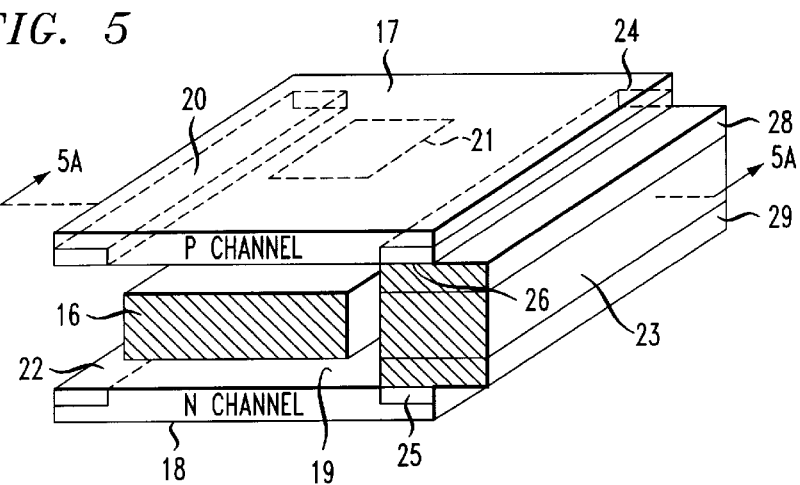
FIG. 5 is a perspective view of the inventive device showing n-type polysilicon being sandwiched between layers of conducting material.
Figure 5A:
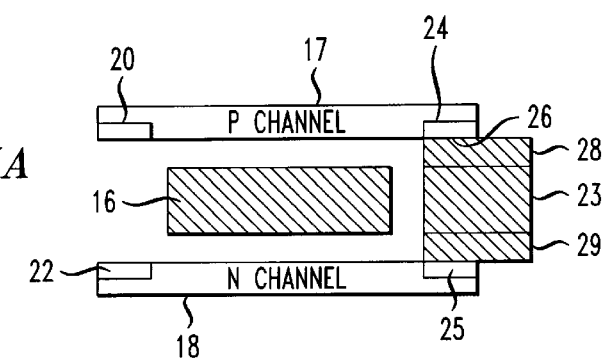
FIG. 5A is a cross sectional view of FIG. 5 along 5A—5A.

Another embodiment of the invention is shown in FIG. 5 where a cross section of the device shown in FIG. 2 is shown with $WSi_2$ layers 28 and 29 inserted between transistors 17 and 18 so as to sandwich n-type polysilicon layer 23. The addition of the $WSi_2$ layers in the manner described above serves to negate the p-n junction effect while maintaining the advantageous isolating characteristics of the n-type polysilicon layers.

Complementary devices having no diode or p-n junction effects as described above can be combined to design SRAM cells such as the one shown in FIG. 2. An improved SRAM cell can be designed with the inventive device where diodes 9 and 10 are eliminated. Other circuits that make use of the complementary configuration disclosed and claimed in this invention can also exploit the improved characteristics of the inventive device.

Regardless of the particular structural design of the complementary device, the concept of shunting out the undesirable p-n junction formed by the various layers of semiconductor material with the use of a conducting layer is a central aspect of this invention.

The device of the present invention has shown to be most useful in the design and fabrication of electronic circuits using thin film transistors. It is understood, however, that various modifications to the illustrative embodiments of the present invention will readily occur to persons with ordinary skill in the art. The discussion in the previous section in conjunction with the drawings focuses on a complementary device with a driving transistor having a first polarity, e.g. a p-type device, and a pull-down transistor having a second polarity type, e.g. an n-type device, it should be noted that the present invention also envisions a complementary device where the first polarity is n-type and the second polarity is p-type. Another example would have interconnecting semiconducting material consisting of both n-type and p-type polysilicon layers with conducting layers inserted to shunt any and p-n junctions created by the particular placement of these layers with respect to each other and with respect to the drain regions of the transistors. A further example would be the use of various types of conducting layers other than WS1$_2$, that are amerable tot he particular fabrication process being used. All such modifications and variations are deemed to be within the scope and spirit of the present invention as defined by the accompanying claims to the Invention.

What is claimed is:

1. A complementary field effect device for eliminating or reducing a diode effect, comprising:
    a thin film field effect transistor of a first polarity having a first drain region;
    a field effect transistor of a second complementary polarity having a second drain region; and
    a conductor positioned to directly physically and electrically interconnect said first and second drain regions to each other and to eliminate said diode effect therebetween, wherein said conductor comprises a polysilicon layer stacked between two layers of a conducting silicide.

2. The device of claim 1, wherein the silicide is WSi$_2$.

3. An SRAM cell having a reduced diode effect, comprising:
    a first complementary transistor device having a drain region;
    a second complementary transistor device having a drain region; and
    a first conductor situated within the cell and physically and electrically interconnecting said drain regions to each other to eliminate said diode effect, said conductor comprising a polysilicon layer stacked between two layers of a conducting silicide.

4. The device of claim 3, wherein the silicide is WSi$_2$.

* * * * *